United States Patent [19]
Dieman, Jr. et al.

[11] Patent Number: 5,641,941
[45] Date of Patent: Jun. 24, 1997

[54] METHOD AND APPARATUS FOR ELECTRICAL CONNECTIONS TO ENCASED ELECTRONIC DEVICES

[75] Inventors: Charles A. Dieman, Jr., Suffield; Andrew C. Johnsen, Simsbury, both of Conn.

[73] Assignee: The Ensign-Bickford Company, Simsbury, Conn.

[21] Appl. No.: 379,340

[22] Filed: Jan. 27, 1995

[51] Int. Cl.$^6$ .................................................. H05K 5/00
[52] U.S. Cl. .......................... 174/52.1; 206/727; 156/60
[58] Field of Search .......................... 174/52.1; 206/721, 206/726, 727; 156/60

[56] References Cited

U.S. PATENT DOCUMENTS

| | | |
|---|---|---|
| 1,791,666 | 2/1931 | Finn . |
| 2,129,540 | 9/1938 | Van Billiard . |
| 2,749,382 | 6/1956 | Lockard . |
| 2,951,112 | 8/1960 | Dahlgren . |
| 2,951,421 | 9/1960 | Katzen . |
| 3,524,921 | 8/1970 | Wolf . |
| 3,701,964 | 10/1972 | Cronin . |
| 3,878,941 | 4/1975 | Kelner ................................. 206/419 |
| 4,031,312 | 6/1977 | Coleman et al. ..................... 174/52 R |
| 4,317,491 | 3/1982 | Tullos et al. . |
| 4,483,393 | 11/1984 | More et al. . |
| 4,886,126 | 12/1989 | Yates, Jr. . |
| 5,192,832 | 3/1993 | Rudy, Jr. et al. ................... 174/52.1 |
| 5,206,460 | 4/1993 | Yang ................................. 174/52.1 |
| 5,432,676 | 7/1995 | Satoh et al. ........................ 361/752 |

*Primary Examiner*—Bot L. Ledynh
*Attorney, Agent, or Firm*—Victor E. Libert; Frederick A. Spaeth

[57] ABSTRACT

A method and apparatus for operably connecting electronic devices through a closed container is achieved by securing one end of a laminate connector (28) to a first electronic device, e.g., a fireset circuit (22). Device (22) is placed in a housing (12) which defines a housing closure surface (16). A cover (14a), which defines a cover closure surface (18) dimensioned and configured to engage the housing closure surface (16), is placed on the housing (12) to define a housing-cover joint (20a), and the laminate connector (28) is disposed within the housing-cover joint (20a). The housing-cover joint (20a) is sealed with an adhesive and the second end of the laminate connector (28) is connected to a second electronic device. The thinness of the laminate connector allows it to pass through the housing-cover joint (20a) without significant adverse affect on the seal therein or on the pressure-bearing ability of the housing (12) or the cover (14a). In one application, the invention may be used to electrically connect an encased fireset to an external arming device.

9 Claims, 1 Drawing Sheet

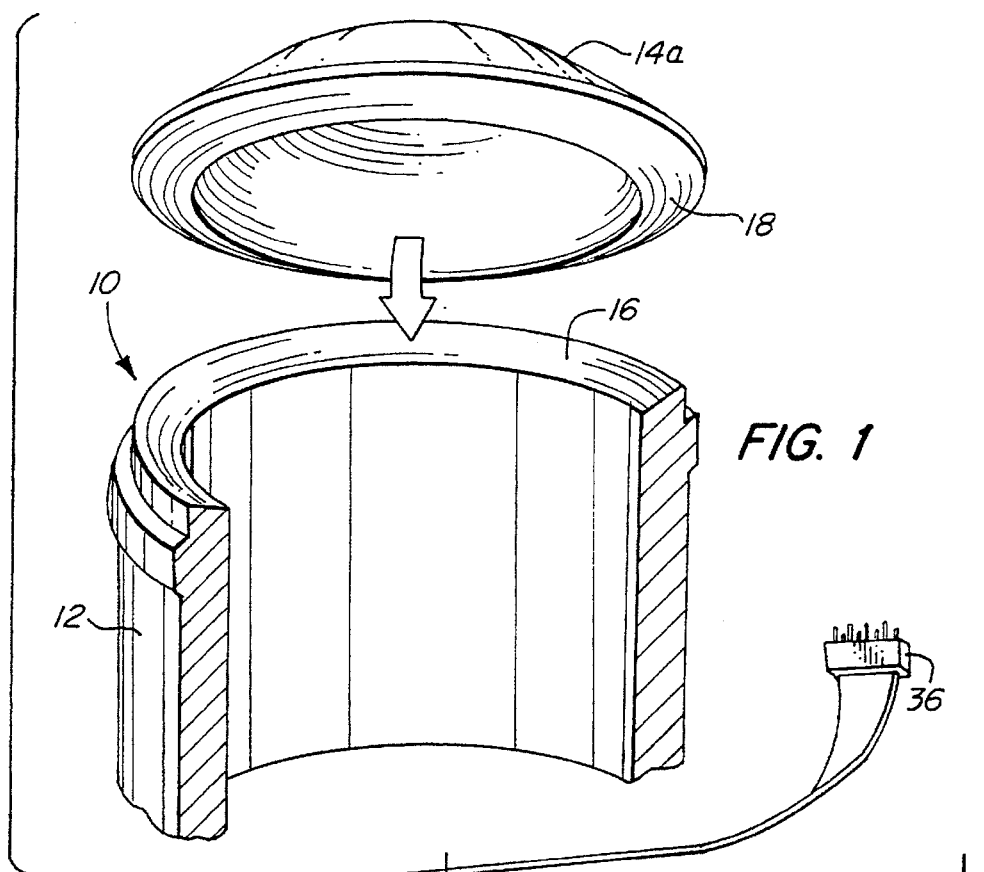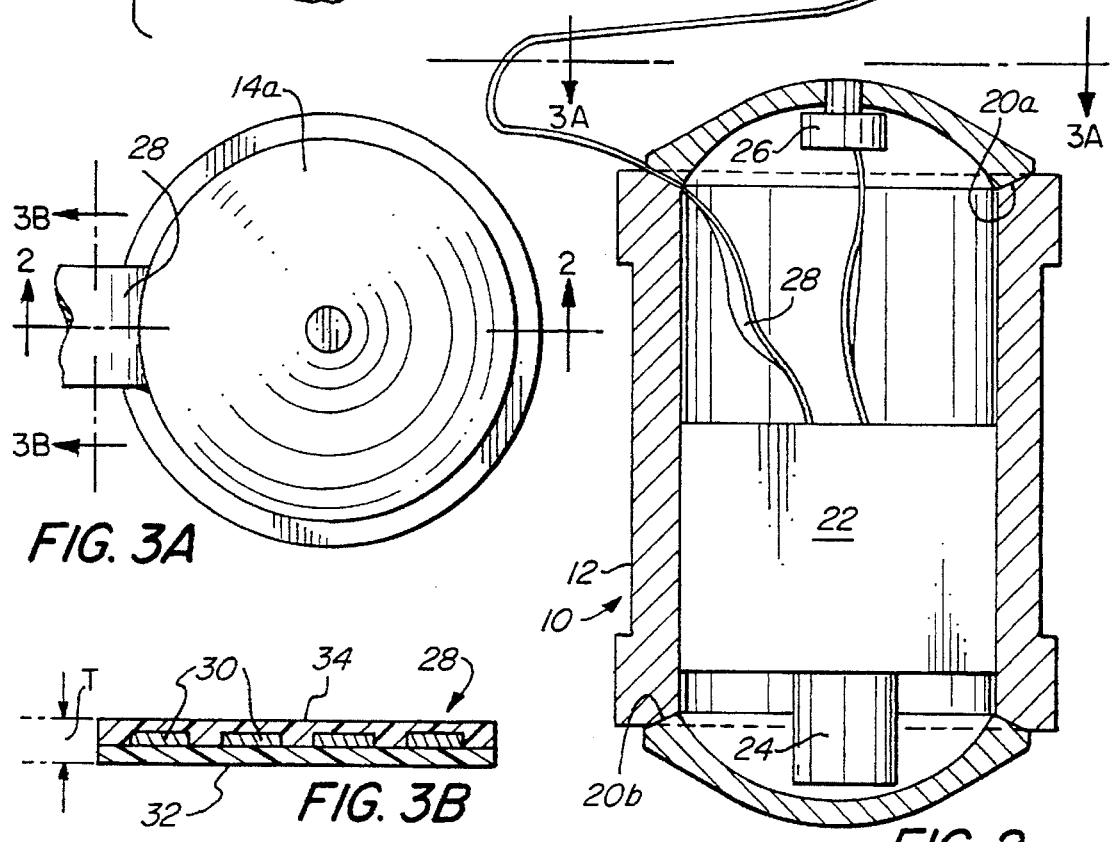

५,६४१,९४१

METHOD AND APPARATUS FOR ELECTRICAL CONNECTIONS TO ENCASED ELECTRONIC DEVICES

BACKGROUND OF THE INVENTION

Field of The Invention

The present invention pertains to connectors for electronic devices, and more particularly to feed-through connectors for encased electronic devices.

In various applications, e.g., in well pipe perforating guns, it is desirable to dispose an electronic circuit or electronic device within a protective casing while maintaining an electrical connection with a second electronic device such as an arming circuit disposed outside the casing. Conventionally, this is achieved by embedding connectors in the casing wall. However, such connectors are expensive and require that the wall be breached and resealed, e.g., by drilling a hole through the housing in which to mount the connector, and then sealing the hole against contaminants, pressure, etc. This is a time-consuming procedure that can damage the structural integrity of the casing, especially when the casing comprises a pulverable material, e.g., a ceramic.

SUMMARY OF THE INVENTION

The present invention relates to a method for operably connecting electrical components through a closed container. The method comprises the steps of securing one end of a laminate connector to a first electronic device, placing the first electronic device in a housing defining a closure surface, placing on the housing a cover that defines a closure surface dimensioned and configured to engage the closure surface of the housing to thereby define a housing-cover joint with the laminate connector being disposed within the housing-cover joint, sealing the housing-cover joint with a sealant, and securing the other end of the laminate connector to a second electronic device situated outside the housing.

The invention also provides an electrical connection and physical isolation apparatus. The apparatus comprises a housing defining a housing closure surface, a first electronic device inside the housing, and a cover associated with the housing closure surface and defining a cover closure surface dimensioned and configured to engage the associated housing closure surface to define a housing-cover joint therebetween. There is adhesive in the housing-cover joint for securing the cover with the cover closure surface in engagement with the housing closure surface and to maintain a seal therebetween. A laminate electrical connector having a first end and a second end is disposed in the housing-cover joint with the first end connected to the first electronic device and the second end disposed outside the housing, for connection to a second electronic device to be electrically connected to, and physically isolated from, the first electronic device.

According to one aspect of the invention, the housing and the cover may both comprise pulverable materials, e.g., a ceramic material such as alumina.

According to another aspect of the invention, the laminate electrical connector has a thickness of not more than about 0.002 inches.

In a particular embodiment, the invention provides an electrical fireset assembly comprising a hydraulic pressure-bearing casing. The casing comprises a ceramic housing defining a housing closure surface and a ceramic cover defining a cover closure surface dimensioned and configured to engage the housing closure surface to define a housing-cover joint. An autonomous fireset device is disposed within the casing, and a laminate connector having two ends is disposed in the housing-cover joint. One end of the laminate connector is in the casing connected to the fireset device, and the other end is outside the casing for connection to an arming device.

BRIEF DESCRIPTION OF THE DRAWINGS

FIG. 1 is a partially cross-sectional, exploded perspective view of a casing for use with the present invention;

FIG. 2 is a schematic cross-sectional view of the casing of FIG. 1 comprising an electronic device therein and a laminate connector extending through the casing in accordance with the present invention;

FIG. 3A is a plan view of the casing of FIG. 2, taken along lines 3A—3A; and

FIG. 3B is a cross-sectional view of the laminate connector of FIG. 3A, taken along lines 3B—3B.

DETAILED DESCRIPTION OF THE INVENTION AND PREFERRED EMBODIMENTS THEREOF

The present invention provides a method and apparatus according to which an electronic device disposed within a casing can be connected to a second electronic device outside the casing without the need to breach the casing wall to mount a connector therein. The invention finds particular utility for connecting electronic devices through a casing having a housing and a cover that cooperate to define a housing-cover joint between them when the casing is closed.

There is shown in the exploded, partly cross-sectional perspective view of FIG. 1 a typical casing with which the present invention finds utility. Casing 10 comprises a housing 12 and a cover 14a. Housing 12 is seen to define housing closure surface 16. Cover 14a defines a cover closure surface 18 that is dimensioned and configured to engage housing closure surface 16 to create a housing-cover joint 20a (FIG. 2) when cover 14a is placed on housing 12. Housing closure surface 16 and cover closure surface 18 are machined so that they engage each other with good surface-to-surface contact. Typically, the housing-cover joint is sealed with a suitable adhesive which serves to secure the cover onto the housing and to provide a seal between them.

Casing 10 is seen in full cross-sectional view in FIG. 2, where housing 12 is seen to be open at both ends and to have a second cover 14b secured thereto at joint 20b. In FIG. 2, casing 10 is seen to enclose an explosive initiating apparatus comprising a fireset circuit 22 and an associated initiator charge 24. Fireset circuit 22 is designed to initiate charge 24 under predetermined conditions, e.g., after a suitable interval following a triggering event or condition. For example, fireset circuit 22 may comprise a timer responsive to a pressure switch 26 which senses the ambient pressure outside casing 10 and sends a firing signal to circuit 22 when a predetermined pressure is sensed.

For purposes of the present invention, fireset circuit 22 is deemed to be a first electronic device. To electrically connect a first electronic device disposed within the casing 10 to a second electronic device disposed outside casing 10, the present invention provides a laminate connector 28 between the two. Laminate connector 28 has two ends, one of which is disposed within casing 10 and is connected to a first electronic device in casing 10, and the other of which is disposed outside casing 10 for connection to a second electronic device. As can be seen in the cross-sectional view of FIG. 3B, laminate connector 28 comprises a plurality of thin bands of electrically conductive material 30, e.g., copper strips, disposed on a thin, flexible, non-conductive support material 32 such as Mylar™ polyester film, with an optional protective top layer 34 of non-conductive material thereon. The laminate connector typically has a thickness T of not more than about 0.002 inch. Accordingly, the laminate connector can be disposed with a layer of adhesive in the housing-cover joint 20a of the casing 10, as shown in FIGS. 2 and 3A, without significant adverse affect on joint 20a, i.e., without adversely affecting the pressure-bearing capability of the housing or the cover or the integrity of the adhesive seal therebetween.

Laminate connector 28 may terminate in an optional modular connector 36 (FIG. 2) which is dimensioned and configured to provide a quick, convenient and optionally releaseable connection to the corresponding modular connector of a second electronic device. For the device illustrated in FIG. 2, the second electronic device external to casing 10 may comprise an external arming circuit which sends an arming signal to fireset circuit 22 via laminate connector 28 to enable fireset circuit 22 to respond to a triggering signal produced by pressure switch 26. Thus, laminate connector 28 permits electrical connection between electronic devices within and without casing 10 even after the casing is sealed and the electronic components are physically isolated from one another by casing 10.

An encased fireset similar to that of FIG. 2 may be employed as part of a well pipe perforating gun of the type described in co-pending U.S. patent application Ser. No. 08/379,303, filed concurrently herewith, the teachings of which are incorporated herein by reference. Briefly restated, the perforating gun comprises a fireset mounted on a generally cylindrical support structure that holds in position a number of explosive penetrating charges. The fireset is operably connected to the charges by a detonating ribbon fuse disposed in initiating relation to the fireset initiating charge and to each of the penetrating charges. The gun, including the encased fireset circuitry, is positioned in a lubricator at the top of a well pipe. Through the use of a laminate connector such as laminate connector 28, the fireset within the casing is electrically connected to an arming circuit in the lubricator. When firing is imminent, the arming circuit sends arming signals to the fireset. Then, the lubricator propels the perforating gun into the well pipe to a desired depth where the fireset initiates the penetrating charges. The charges perforate the well pipe, allowing oil or gas to flow into the pipe to be recovered at the surface. When the gun is fired into the well pipe, the modular connector joining the laminate connector to the arming circuit is destroyed, but since the fireset is safely disposed within the casing, the gun can operate autonomously.

While the invention has been described in detail with respect to a particular application thereof, i.e., in connection with well pipe perforating guns, this is not an intended limitation. Rather, those skilled in the art will recognize that the invention may be practiced in other areas, e.g., to provide electrical connections to electronic devices encased to operate in deep water.

We claim:

1. A method for operably connecting electrical components through a closed container, comprising:

securing one end of a laminate connector to a first electronic device;

placing the first electronic device in a housing defining a closure surface;

placing a cover on the housing, the cover defining a closure surface dimensioned and configured to engage the closure surface of the housing to define a housing-cover joint, the laminate connector being disposed within the housing-cover joint;

sealing the housing-cover joint with an adhesive sealant to maintain a seal between the cover closure surface and the housing closure surface; and securing the other end of the laminate connector to a second electronic device situated outside the housing.

2. The method of claim 1 wherein the first electronic device comprises an autonomous electrical fireset.

3. An electrical connection and physical isolation apparatus comprising;

a housing defining a housing closure surface;

a first electronic device inside the housing;

a cover associated with the housing closure surface and defining a cover closure surface dimensioned and configured to engage the associated housing closure surface to define a housing-cover joint therebetween;

adhesive in the housing-cover joint for securing the cover to the housing with the cover closure surface in engagement with the housing closure surface to thereby maintain a seal therebetween; and a laminate electrical connector having a first end and a second end and being disposed in the housing-cover joint with the first end connected to the first electronic device and the second end disposed outside the housing for connection to a second electronic device to be electrically connected to, and physically isolated from, the first electronic device.

4. The apparatus of claim 3 wherein the housing and the cover both comprise a pulverable material.

5. The apparatus of claim 4 wherein the pulverable material comprises a ceramic material.

6. The apparatus of claim 5 wherein the ceramic material comprises alumina.

7. The apparatus of claim 3 or claim 5 wherein the laminate electrical connector has a thickness of not more than about 0.002 inches.

8. The apparatus of claim 3, claim 4, claim 5 or claim 6 wherein the first electronic device comprises an autonomous fireset.

9. The apparatus of claim 7 wherein the first electronic device comprises an autonomous fireset.

* * * * *